United States Patent
Getty et al.

(10) Patent No.: US 11,398,517 B2
(45) Date of Patent: Jul. 26, 2022

(54) OPTICAL DEVICE HAVING A DETECTOR AND AN OPTICAL ELEMENT MOUNTED ON AN EPOXY FENCE

(71) Applicant: RAYTHEON COMPANY, Waltham, MA (US)

(72) Inventors: Jonathan Getty, Goleta, CA (US); Bradly Eachus, Buellton, CA (US); David Brehl, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 142 days.

(21) Appl. No.: 16/811,467

(22) Filed: Mar. 6, 2020

(65) Prior Publication Data
US 2021/0280626 A1    Sep. 9, 2021

(51) Int. Cl.
*H01L 27/146* (2006.01)
*H01L 21/683* (2006.01)

(52) U.S. Cl.
CPC .... *H01L 27/14634* (2013.01); *H01L 21/6835* (2013.01); *H01L 27/1469* (2013.01); *H01L 27/14618* (2013.01); *H01L 27/14621* (2013.01); *H01L 27/14625* (2013.01); *H01L 27/14627* (2013.01); *H01L 27/14636* (2013.01); *H01L 27/14685* (2013.01); *H01L 2221/68381* (2013.01)

(58) Field of Classification Search
CPC ......... H01L 27/14618; H01L 27/14625; H01L 27/14627; H01L 27/14685; H01L 31/0232; H01L 31/02325
See application file for complete search history.

(56) References Cited

U.S. PATENT DOCUMENTS

2005/0205898 A1     9/2005   Van Arendonk et al.

FOREIGN PATENT DOCUMENTS

EP        3534292 A1     9/2019

OTHER PUBLICATIONS

Notification of Transmittal of the International Search Report of the International Searching Authority, or the Declaration; PCT/US2021/012166; dated Mar. 22, 2021, 5 pages.
Notification of Transmittal of the International Written Opinion of the International Searching Authority, PCT/US2021/012166; dated Mar. 22, 2021, 6 pages.

*Primary Examiner* — David A Zarneke
(74) *Attorney, Agent, or Firm* — Cantor Colburn LLP

(57) ABSTRACT

A method of forming an image detector from an optical detector having a first side connected to a substrate and a second side opposite the first side. The method includes: receiving the detector; electrically coupling the second side of the detector to a read out integrated circuit (ROIC); securing the detector to the ROIC with an adhesive, wherein the adhesive surrounds the detector and at least a portion of the substrate. The method also includes chemically removing at least some of the substrate to expose an exposed portion of the first side of the detector. Such removal results in the formation of an adhesive fence from the adhesive that has a fence upper surface that is above the first side on which an optical element is mounted such that an air gap exists between the first side of the detector and the optical element.

17 Claims, 10 Drawing Sheets

OPTICAL DEVICE HAVING A DETECTOR AND AN OPTICAL ELEMENT MOUNTED ON AN EPOXY FENCE

BACKGROUND

The present disclosure relates to optical devices and, in particular, to an optical device that includes an optical element mounted on an adhesive fence so that it is separated from a detector.

Image sensors used in image capturing devices generate charge in proportion to light intensity received at the image sensor from a scene viewed by the image sensor. The sensors (or optical devices) can include a detector that receives the light and generates an electrical output based therefrom. For example, the detector can include an array of photosensitive/energy wavelength sensitive detector unit cells arranged in an X×Y matrix. Each of the detector unit cells may accumulate charge or produce a current and/or voltage in response to light incident upon the detector unit cell and may correspond to a pixel in a captured electronic image. One or more of the detector unit cells may include a photovoltaic detector (e.g., a photovoltaic single absorber detector or a photovoltaic multi-absorber (multi-junction) detector), a barrier device detector, a position sensitive detector (PSD) or other suitable detector.

Typically, a read out integrated circuit (ROIC) is connected to the detector and based on accumulated voltage/current and produces a digital or analog output. The ROIC can be formed as an array of ROIC unit-cells that are arranged in an X×Y matrix corresponding to the chiral orientation of the X×Y matrix of the detector unit cells. Thus, each ROIC unit-cell may be interconnected with a corresponding detector unit cell by way of one or more direct bond interconnects, such as direct metal-to-metal interconnects or indium interconnects.

SUMMARY

According to one embodiment, a method of forming an image detector from an optical detector having a first side connected to a substrate and a second side opposite the first side, is disclosed. The method includes: receiving the detector; electrically coupling the second side of the detector to a read out integrated circuit (ROIC); securing the detector to the ROIC with an adhesive, wherein the adhesive surrounds the detector and at least a portion of the substrate; chemically removing at least some of the substrate to expose an exposed portion of the first side of the detector, wherein chemically removing at least some of the substrate results in the formation of an adhesive fence from the adhesive that has a fence upper surface that is above the first side; and mounting an optical element on the upper surface of the adhesive fence such that an air gap exists between the first side of the detector and the optical element.

In any prior method, the method can father include removing portions of the substrate and the adhesive such that upper surfaces of both of substantially planar before chemically removing portions of the substrate.

In any prior method, the air gap can have a maximum depth of 5 microns.

In any prior method, removing portions of the substrate can include removing all of the substrate.

In any prior method, the second side is electrically coupled by interconnects contained in an interconnect layer and wherein the adhesive fence is formed by providing epoxy near an end of the optical detector such that it is wicked under the detector and between the connectors.

In any prior method, chemically removing at least some of the substrate includes selectively etching the substrate.

In any prior method, machining the upper surface of the adhesive fence after chemically removing at least some of the substrate. The machining can include employing a diamond point turning process that causes the upper surface to be level with the exposed portion. In such a case, removing portions of the substrate can include removing all of the substrate.

In any prior method, the optical element is one of a polarizer, a lens, a micro-lens array or a filter.

In one embodiment, chemically removing substrate includes removing some of the substrate to create a thinned substrate with a thinned substrate upper surface that is below the upper surface of the epoxy fence and mounting an optical element on the upper surface of the epoxy fence such that an air gap exists between the thinned substrate upper surface and the optical element. This embodiment can be combined with any prior disclosed method.

Also disclosed is an image detector. The image detector includes: a detector having a first side and a second side opposite the first side; a read out integrated circuit (ROTC) electrically coupled to the second side of the detector; an adhesive fence surrounding the detector and having an upper surface that is above the first side of the detector; and an optical element on the upper surface of the adhesive fence such that an air gap exists between the first side and the optical element.

In any prior image detector, the first side of the optical detector is connected to a substrate that covers some or all of the first side.

Further, it shall be understood that the disclosed image detector can be formed such that exhibits any of the above disclosed gaps and formed according to any of the above methods.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

In some instances, a particular optical device may need to have an optical element disposed between the optical detector and the field of view. For example, a polarizer a lens, a micro-lens array or a filter or other optical element may need to be disposed between the field of view and the detector.

In many cases the detector is formed as an integrated circuit or "chip". To place, for example, an optical element in the field of the chip, in prior systems the element was glued or bonded with indium bumps to the back of an existing chip. This is complex, and requires bonding directly to the back of a fragile, thinned chip as will be understood from the below. Such bonding method also may experience difficulties in controlling a standoff distance between the chip and the optical element.

Herein disclosed is a method and device that utilizes an adhesive fence that is formed when the optical detector is joined to the ROIC. The adhesive that ultimately forms the fence is wicked under the detector and between the connectors coupling the detector and the ROIC and is also on sides of both the detector and the substrate on which the detector is formed or otherwise located. One commonly used adhesive is epoxy but other adhesives could be used.

The substrate on which the detector is formed as well as the adhesive is machined to thin the substrate. The substrate is then selectively etched (i.e. more than the adhesive). The remaining adhesive forms a fence around the surface of the detector. This fence can itself be machined if desired, and optical elements can be mounted to the fence, which functions as an integrated precision standoff such that an air gap is defined between the optical element and the detector.

The image detector formed by this method may be a focal plane array (FPA), active pixel sensor (APS) or any other suitable energy wavelength sensing device. The image detector may be used as a component of a photographic and/or image capturing device, such as a digital camera, video camera or other similar device. The image detector may include the detector, the ROIC and the optical device.

Turning now to the figures, a process for forming an optical device and embodiments of the device are illustrated. The succession of figures will inform the skilled artisan of embodiments of the methods.

Figure 1:
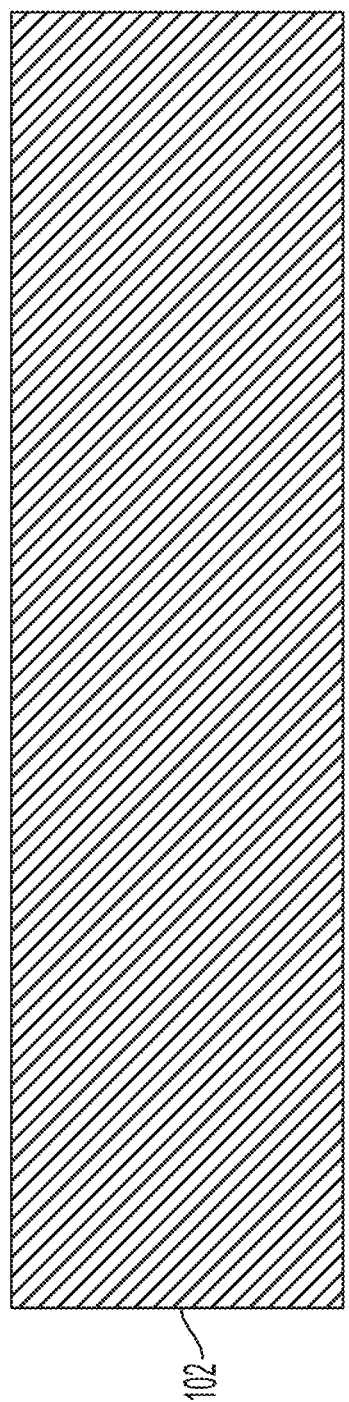
FIG. 1 is a cross-section of a substrate on which embodiments may be formed.

FIG. 1 shows an example of a base substrate 102 (substrate). The base substrate 102 may comprise any substantially intrinsic semiconductor substrate (e.g., purely intrinsic or very lightly-doped), including without limitation silicon, cadmium zinc tellurium, germanium, silicon carbide, aluminum arsenide antimonide, gallium antimonide, gallium arsenide, gallium nitride, gallium phosphide, indium antimonide, indium arsenide, indium arsenide antimonide, indium gallium arsenide, indium nitride, indium phosphide, mercury cadmium tellurium, silicon germanium, or other suitable semiconductor material. The material or materials used for the base substrate may be selected based on desired characteristics for a unit cell to be fabricated thereon.

Figure 2:
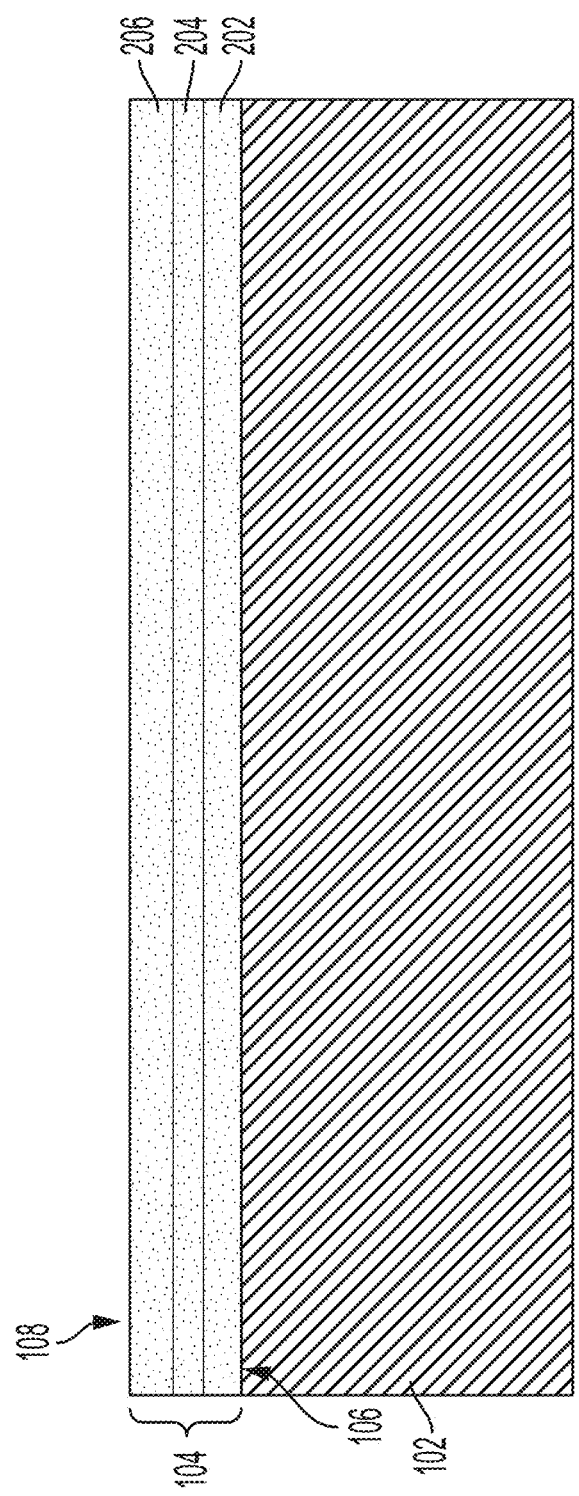
FIG. 2 is a cross-section of a structure that includes a detector on top of the substrate.

A detector 104 is then grown on the substrate 102 as shown in FIG. 2. The detector can be any type of element that can detect an image. As shown, the detector 104 includes a first side 106 that contacts or is otherwise connected to the substrate 102. The connection can be direct or there may be layers between the first side 106 and substrate 102. The detector 104 also includes a second side 108 opposite the first side 106.

Although various connections and positional relationships (e.g., over, below, on, adjacent, etc.) are set forth between elements/layers in the following description and in the drawings, the skilled artisan will understand many of the positional relationships described herein are orientation-independent when the described functionality is maintained even though the orientation is changed. Further, the terms "upper," "lower," "right," "left," "vertical," "horizontal," "top," and "bottom," relate to the described structures and methods based on the orientation of the figures. Further, to the extent that the term direct contact is used herein or recited in claims, such direct contact means that two element are connected without any intermediary conducting, insulating or semiconductor layers at the interface of the two elements In one embodiment, the detector 104 can include one or more layers. Examples of such layers are shown in FIG. 2 but are not required. For example, the detector can include an absorber layer 202, a separation layer 204 and a contact layer 206. The various layers of the detector may be grown on the base substrate 102. The absorber layer 202 may be operable to absorb incident photons such that the absorbed photons excite positive and negative charges in the absorber layer 202. The absorber layer 202 may include any substantially doped semiconductor substrate (e.g., dopant concentration between approximately $2\times10^{14}$ cm$^{-3}$ and approximately $5\times10^{17}$ cm$^{-3}$), including, without limitation, the semiconductors set forth above with respect to the base substrate. The absorber layer 202 may be an n-type semiconductor, a p-type semiconductor or an intrinsic semiconductor. The material or materials used for absorber layer 202 may be selected based on desired characteristics for the unit cell (e.g., a material may be selected with a bandgap suitable for photon absorption and thus light detection of a particular wavelength or range of wavelengths). The absorber layer 202 may be grown to a thickness of between approximately 1.0 µm and approximately 25.0 µm (e.g., to ensure absorber layer 202 is sufficiently thick to capture light of a particular intensity yet thin enough to collect photo-generated charge carriers).

The separation layer 204 may include a barrier layer, a junction layer or other suitable layer operable to receive charged carriers from the absorber layer 202 and to separate first charged carriers for collection at a first contact from second charged carriers for collection at a second contact. The first charged carriers may be charges having a first or positive polarity and the second charged carriers may be charges having a second or negative polarity (e.g., a polarity opposite that of the first charged carriers). The separation layer 204 may include any doped or undoped semiconductor, including without limitation the semiconductors set forth above with respect to the base substrate. The dopant concentration may be between approximately $2\times10^{14}$ cm$^{-3}$ and approximately $5\times10^{17}$ cm$^{-3}$. The separation layer 204 may include the same type of doping as the absorber layer 202 (e.g., both n-type or both p-type). For example, certain barrier devices may use the same type of doping in the absorber layer 202 and the separation layer 204. Alternatively, separation layer 204 may include a different type of doping than the absorber layer 202 (e.g., absorber layer 202 may include n-type doping and separation layer 204 may include p-type doping or vice versa). For example, junction devices and certain barrier devices may use opposite doping in the absorber layer 202 and the separation layer 204. The separation layer 204 may be grown to a thickness of between approximately 0.05 μm and approximately 2.0 The material or materials used for the separation layer 204, the dopant concentration of the separation layer 204, the thickness of the separation layer 204 and/or other physical characteristics of the separation layer 204 may be selected based on desired characteristics for the unit cell.

Figure 3:
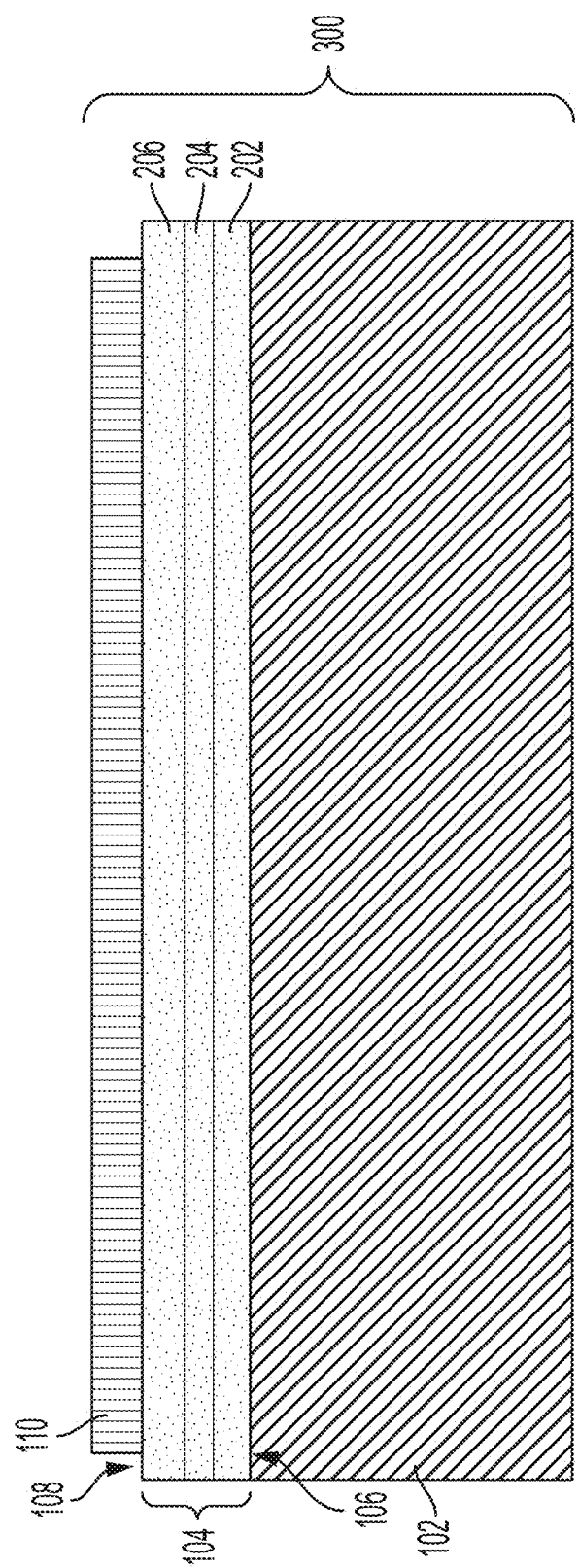
FIG. 3 a cross-section of a workpiece formed after an interconnect layer is attached to the detector.
Figure 4:
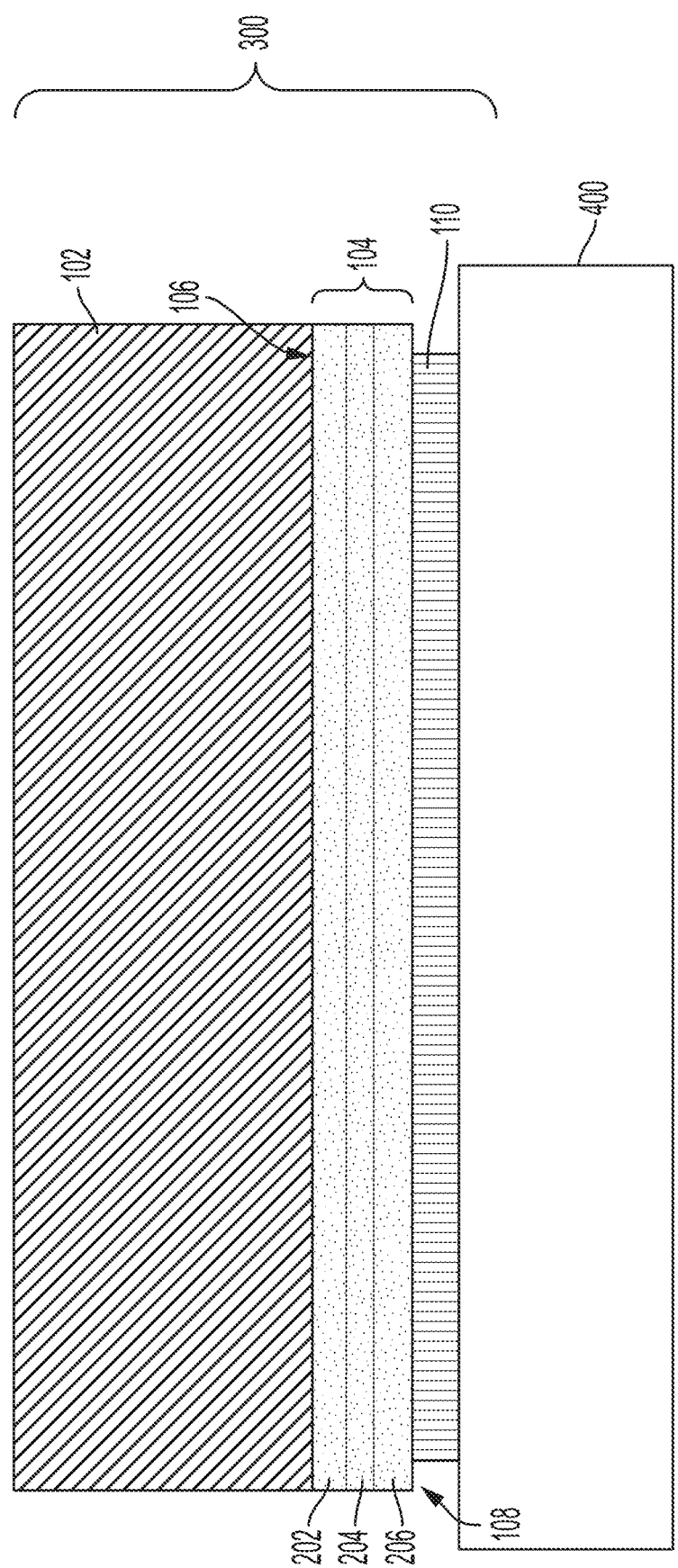
FIG. 4 is a cross-section showing the workpiece of FIG. 3 flipped over and connected to a ROIC to form an assembly.

The contact layer 206 is provided to contact interconnects. As shown in FIG. 3, the contact layer 206 is coupled to one or more direct bond interconnects schematically shown as being in an interconnect layer 110. The manner which the interconnect layer 110 is formed can vary based on the needs of the connection and the skilled artisan can select how the interconnect layer 110. As shown in FIG. 3, second side 108 of the detector 104 contacts or is otherwise connected to the interconnect layer 110. The connection can be direct or there may be layers between the second side 108 (or contact layer 206) and the interconnect layer 110.

The contact layer 206 may include any highly-doped semiconductor substrate (e.g., dopant concentration between approximately $1 \times 10^{16}$ cm$^{-3}$ and approximately $5 \times 10^{18}$ cm$^{-3}$), including without limitation the semiconductors set forth above with respect to the base substrate. The contact layer 206 may include the same type of doping as the absorber layer 202 (e.g., both n-type or both p-type). Alternatively, the contact layer 206 may include a different type of doping than the absorber layer 202 (e.g., the absorber layer 202 may include n-type doping and the contact layer 206 may include p-type doping or vice versa). The contact layer 206 may be grown to a thickness of between approximately 0.1 μm and approximately 3.0 μm. The material or materials used for the contact layer 206, the dopant concentration of the contact layer 206, the thickness of the contact layer 206 and/or other physical characteristics of the contact layer 206 may be selected based on desired characteristics for the unit cell. For example, certain physical characteristics may be selected based on a desired resistivity for the contact layer 206.

As described above, the materials for each layer may be selected based on desired characteristics of the unit cell. In certain embodiments, the layers may comprise III-V materials. The III-V materials may include at least a first element found in group III of the periodic table and a second element found in group V of the periodic table. Group III elements may have three electrons in their outer-most electronic shell; examples include boron, aluminum, gallium, indium, and thallium. Group V elements may have five electrons in their outer-most electronic shell; examples include nitrogen, phosphorus, arsenic, antimony, and bismuth. The III-V materials may be well-suited to withstanding the high temperatures associated with interconnecting the unit cell and integrated circuit 140 with a direct bond interconnect to another element via the interconnect layer 106. In certain embodiments, the III-V materials may include gallium antimonide in the base substrate, indium arsenide antimonide in absorber layer 202 and contact layer 206, and aluminum arsenide antimonide in separation layer 204. In certain embodiments, materials comprising antimonide or mercury cadmium tellurium may be well-suited to a unit cell designed to detect infrared light. In certain embodiments, materials comprising indium gallium arsenide or silicon germanium may be well-suited to a unit cell designed to detect visible light.

As shown in FIG. 3, at this stage a workpiece 300 comprising the substrate 102, the detector 104 and the interconnect layer 110 has been created. The workpiece 300 can then be flipped over or otherwise arranges such the detector 104 is electrically connected to a read out integrated circuit (ROIC) 400 via the interconnect layer 110.

The ROIC 400 produces a digital or analog output based on accumulated voltage/current received from the detector 104 via the interconnect layer. As discussed above, the ROIC can be formed as an array of ROIC unit-cells that are arranged in an X×Y matrix corresponding to the chiral orientation of the X×Y matrix of the detector unit cells in the detector 104. Thus, each ROIC unit-cell may be interconnected with a corresponding detector unit cell by way of one or more direct bond interconnects, such as direct metal-to-metal interconnects or indium interconnects in the interconnect layer 110.

Figure 5:
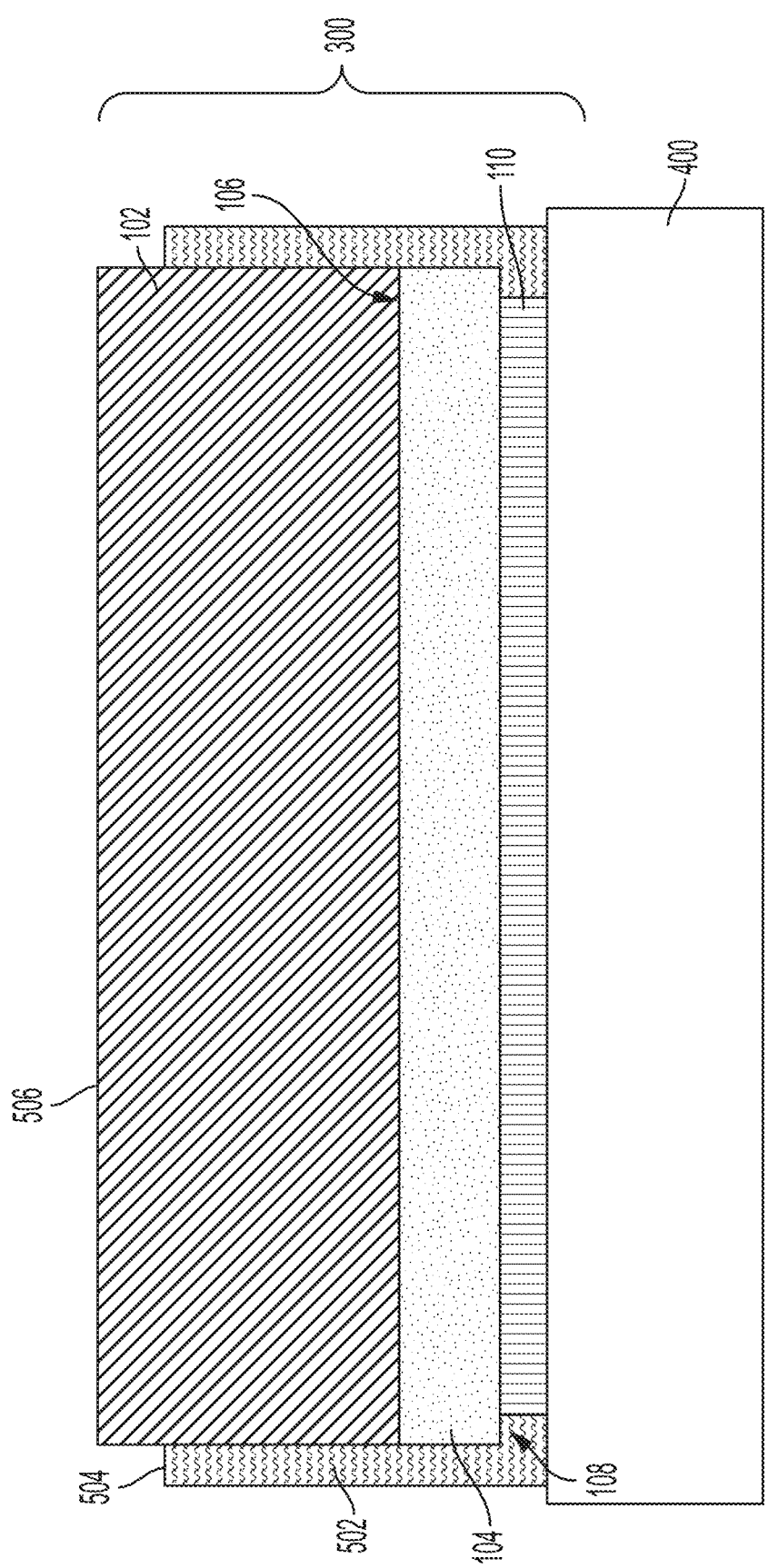
FIG. 5 is a cross-section showing the assembly after an adhesive has been allowed to wick under the detector.

Referring now to FIG. 5, to secure the workpiece 300 an adhesive material is provided near an end of the detector such that it is wicked under the detector 104 and between the interconnects (shown as lines) in the interconnect layer 110. The adhesive provides physical protection and mechanical strength connection between the detector 104 and the interconnect layer. As shown below, the adhesive will ultimately form a fence onto which an optical element can be mounted. One example of such an adhesive is epoxy.

For clarity, in the remainder of the discussion herein the detector 104 will be shown as a single layer.

In FIG. 5, the adhesive is labelled as element 502. While not visible, it shall be understood that some of the adhesive 502 may be located under the detector 104 and between the interconnects in the interconnect layer 110. The adhesive secures the detector 104 to the ROIC 400 and surrounds the detector 104 and at least a portion of the substrate 102. The adhesive has an upper surface 504 and the substrate 104 has an upper surface 506.

Figure 6:
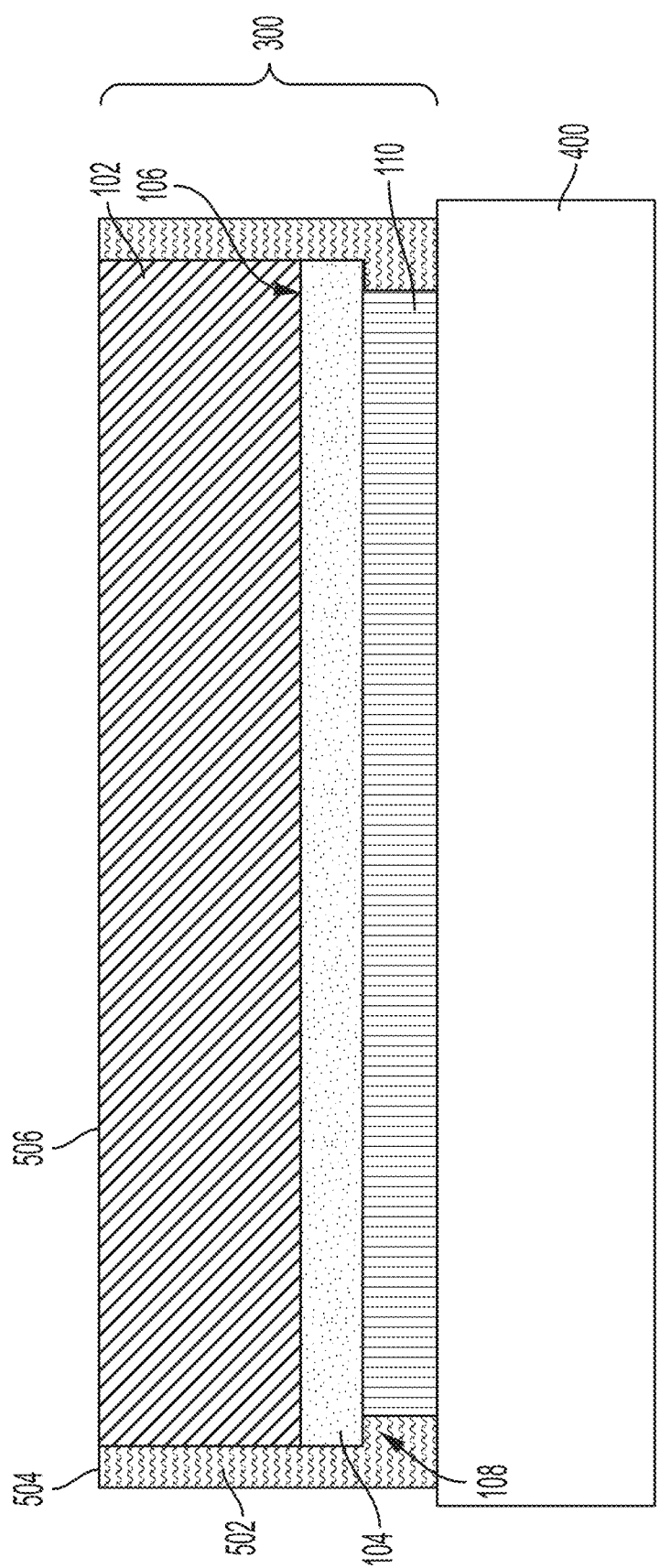
FIG. 6 shows the assembly of FIG. 5 after the substrate has been thinned by an optional mechanical process.

A removal process can be applied to level the upper surfaces 504, 506. In one embodiment, they are leveled so that they are substantially co-planar as shown in FIG. 6 but that is not required. Removal/etching is any process that removes material from the wafer. Examples include etch processes (either wet or dry), and chemical-mechanical planarization (CMP), and the like. Further, herein reference is made to utilizes a diamond-upped lathe tool to achieve sub-nanometer level surface finishes and sub-micrometer form accuracies.

Figure 7:
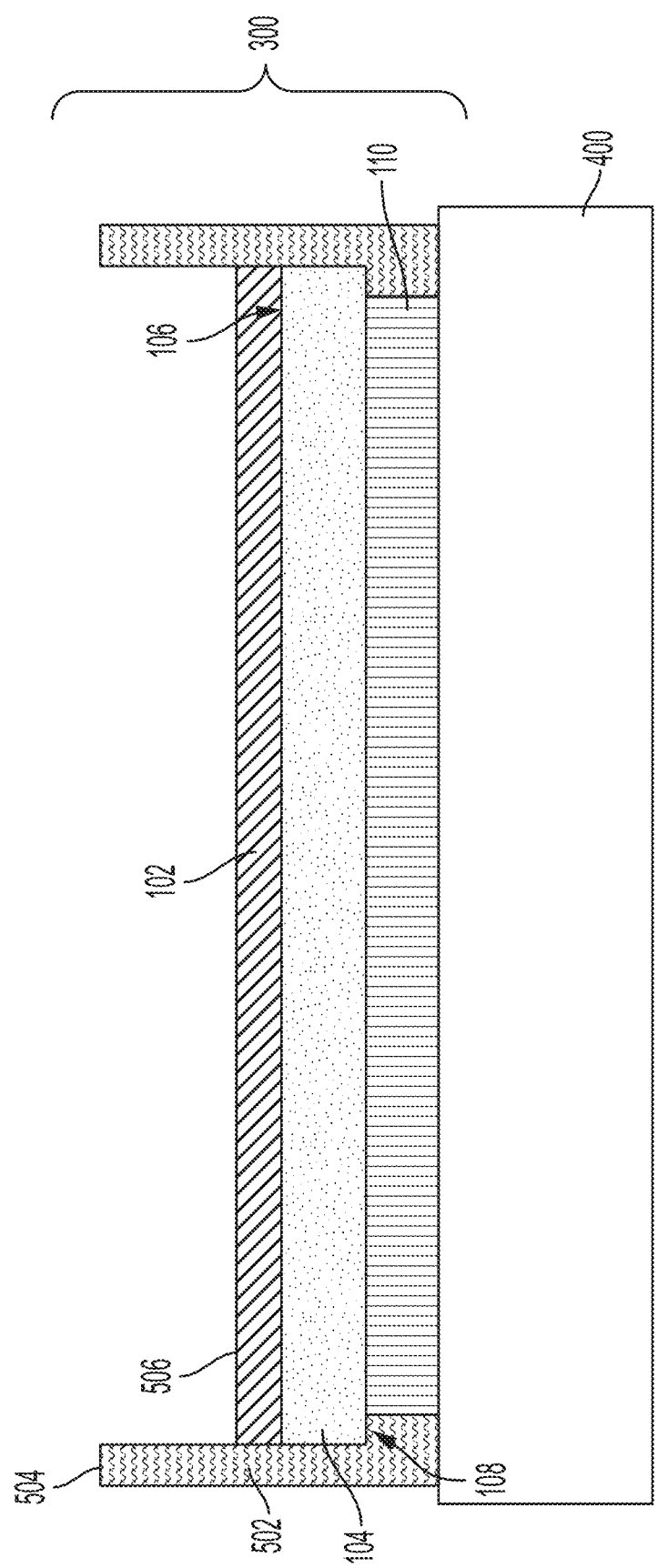
FIG. 7 shows the assembly of FIG. 8 after the substrate has been thinned by a chemical process so that an adhesive fence surrounds the detector.

Regardless of whether the removal process is performed, a chemical etching process can be performed on the structure of FIG. 6 form the structure shown in FIG. 7. In one embodiment, the chemical removal process is a selective etch to the material of the substrate that removes at least some of the substrate 102. In such a selective etch, the etchant will remove the material of the substrate faster than it reduces the adhesive. As such, after the chemical etch is performed, the upper surface 504 of the adhesive 502 is above the upper surface 506 of the substrate 102. In such a configuration, the upper surface 504 provides border/ring on to which an optical element can be mounted. For clarity in naming, the resultant adhesive form remaining is referred to as an adhesive fence 802 and has an adhesive fence upper surface 804 in FIG. 8 and hereinafter.

Figure 8:
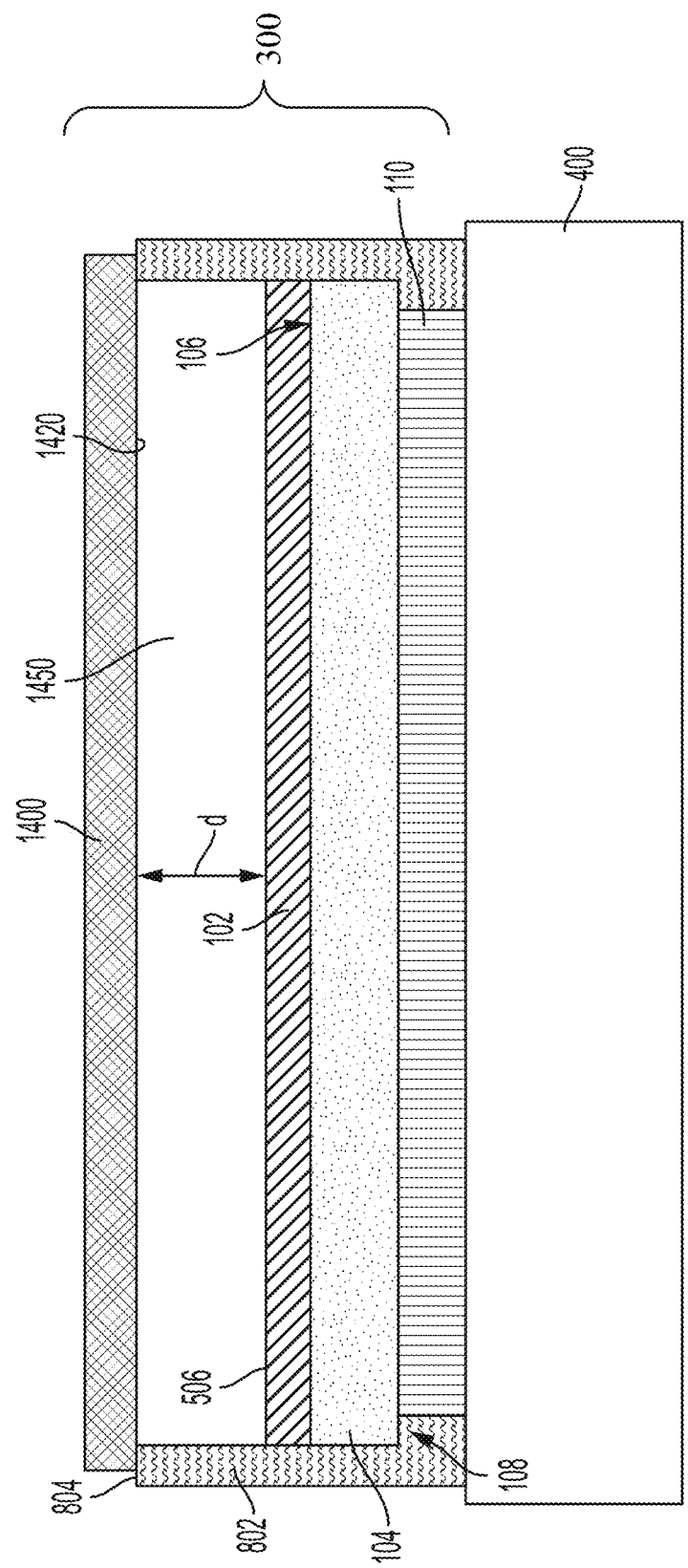
FIGS. 8-10 show different devices formed after an optical element is mounted on the adhesive fence with each having a different amount of substrate removed.

In FIG. 8 a portion of the substrate 102 remains. However, the etch can be performed such that no substrate remains (FIG. 9) or such that some remains but exposes an exposed portion 1002 of the first side 106 of the detector 104 (FIG. 10).

Figure 9:
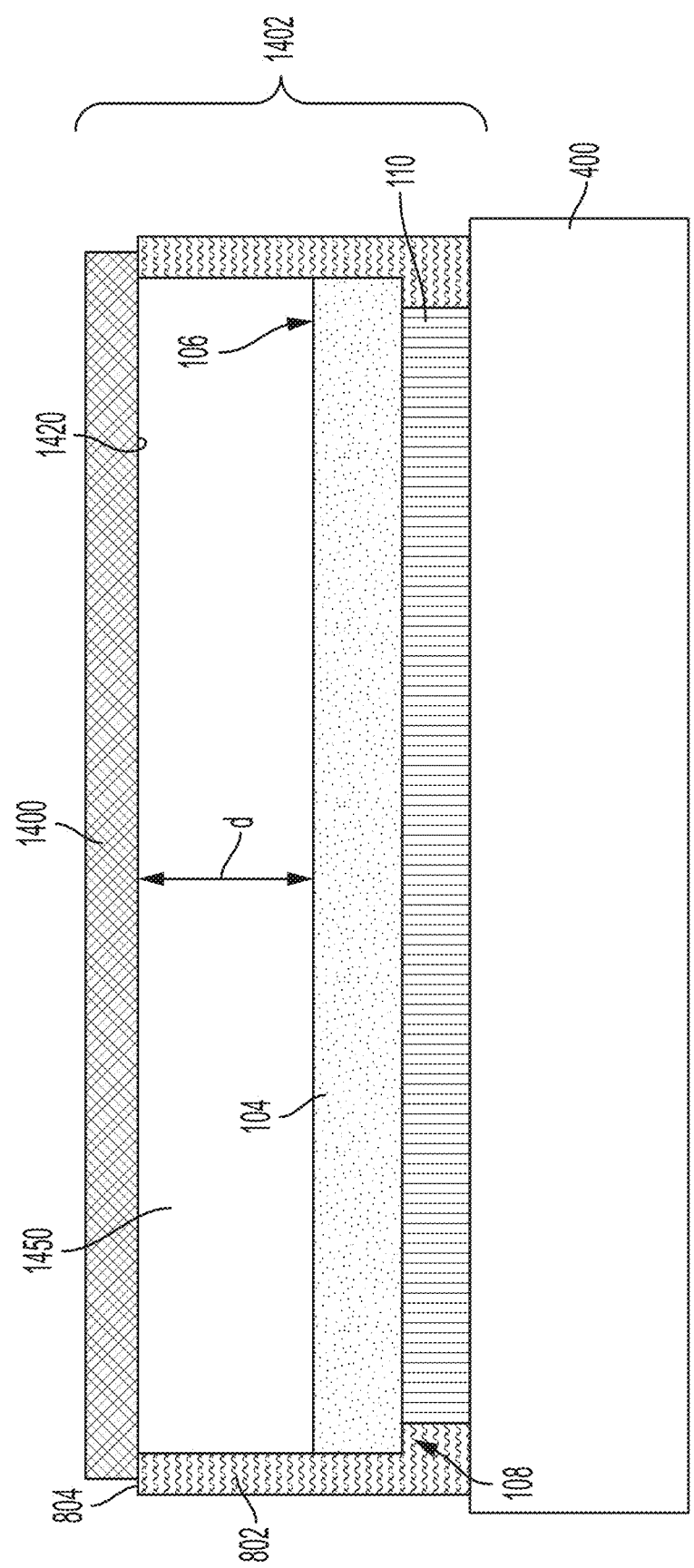
Figure 10:
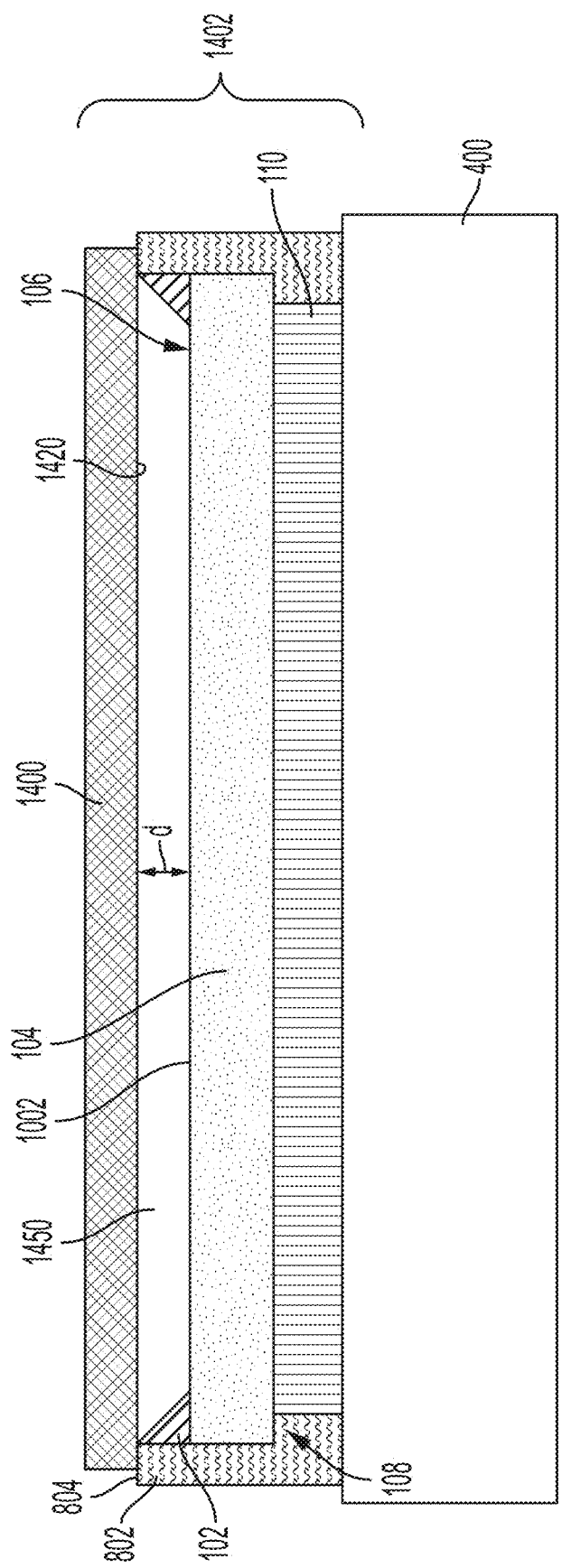

In all cases, and with reference to FIGS. 8-10, an optical element 1400 can be mounted on the upper surface 804 of the adhesive fence 802 to form an image detector 1402. The fence 802 provides a surface that allows the optical element to 1400 to be mounted such an air gap (gap) is provided below it. The air gap can have a depth d. Depending on the configuration the depth d can be measured from a bottom 1420 of the optical element 1400 to the first side 106 of the detector 104 (FIG. 8), from the bottom 1420 of the optical element 1400 to the thinned substrate upper surface 506 of the substrate 102 (FIG. 8), or from the bottom 1420 of the optical element 1400 to the exposed portion 1002 of the first side 106 of the detector 104 (FIG. 10). In aspects of each of these configurations, the depth d can be limited to 5 microns (e.g., air gap has a maximum depth of 5 microns). Of course, other depths could be used depending on the context.

The depth can be controlled in multiple ways. First, by etching the substrate a precise, known amount, the fence can act as a standoff of precise height. However, if the etch is not exact, the depth can be adjusted by mechanically lowering the upper surfaces 804 of the adhesive fence 802. This can be done, for example, by a DPT process. Further, a DPT process may be employed to make the upper surfaces 804 of the adhesive fence 802 parallel to the first side 106 of the detector 104.

In view of the above is will be understood that adhesive under-fill "fence" left behind after chemical substrate removal can mount the optical element 1400 (e.g., a polarizer, a lens, a micro-lens array or a filter) a controlled distance above the detector 104. Further, it shall be understood that attaching the optical element 1400 to the adhesive fence 802 can reduce or eliminate the stress placed on the detector 104 that may have been experience by gluing or otherwise connecting the optical device directly to the detector 104. By etching the chip a precise, known amount, the epoxy fence can act as a standoff of precise height. 2b. Further, because the optical element can sit directly on the epoxy fence, no depth uncertainty is added by the bonding method as in prior solutions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of forming an image detector from an optical detector having a first side connected to a substrate and a second side opposite the first side, the method comprising:
   receiving the detector;
   electrically coupling the second side of the detector to a read out integrated circuit (ROIC);
   securing the detector to the ROIC with an adhesive, wherein the adhesive surrounds the detector and at least a portion of the substrate;
   chemically removing at least some of the substrate to expose an exposed portion of the first side of the detector, wherein chemically removing at least some of the substrate results in the formation of an adhesive fence from the adhesive that has a fence upper surface that is above the first side; and
   mounting an optical element on the upper surface of the adhesive fence such that an air gap exists between the first side of the detector and the optical element.

2. The method of claim 1, further comprising removing portions of the substrate and the adhesive such that upper surfaces of both are substantially planar before chemically removing portions of the substrate.

3. The method of claim 1, wherein the air gap has a maximum depth of 5 microns.

4. The method of claim 1, wherein removing portions of the substrate includes removing all of the substrate.

5. The method of claim 1, wherein the second side is electrically coupled by interconnects contained in an interconnect layer and wherein the adhesive fence is formed by providing epoxy near an end of the optical detector such that it is wicked under the detector and between the connectors.

6. The method of claim 5, wherein chemically removing at least some of the substrate includes selectively etching the substrate.

7. The method of claim 6, further comprising machining the upper surface of the adhesive fence after chemically removing at least some of the substrate.

8. The method of claim 7, wherein the machining includes employing a diamond point turning process that causes the upper surface to be level with the exposed portion.

9. The method of claim 1, wherein the optical element is one of a polarizer, a lens, a micro-lens array or a filter.

10. A method of forming an image detector that includes detector having a first side connected to a substrate and a second side opposite the first side, the method comprising:
    receiving the detector;
    electrically coupling the second side of the detector to a read out integrated circuit (ROIC);
    securing the detector to the ROIC with an adhesive, wherein the adhesive surrounds the detector and at least a portion of the substrate and forms an epoxy fence having an upper surface;
    chemically removing some of the substrate to create a thinned substrate with a thinned substrate upper surface that is below the upper surface of the epoxy fence; and
    mounting an optical element on the upper surface of the epoxy fence such that an air gap exists between the thinned substrate upper surface and the optical element.

11. The method of claim 10, further comprising removing portions of the substrate and the adhesive such that upper surfaces of both are substantially planar before chemically removing portions of the substrate.

12. The method of claim 10, wherein the air gap has a minimum depth of 5 microns.

13. The method of claim 10, wherein the second side is electrically coupled by connectors and wherein the epoxy fence is formed by providing epoxy near an end of the optical detector such that it is wicked under the detector and between the connectors.

14. The method of claim 13, wherein chemically removing at least some of the substrate includes selectively etching the substrate.

15. The method of claim 14, further comprising machining the upper surfaces of the epoxy after chemically removing some of the substrate.

16. The method of claim 15, wherein the machining includes employing a diamond point turning process that causes the upper surfaces to be level with the exposed portion.

17. The method of claim 10, wherein the optical element is one of a polarizer, a lens, a micro-lens array or a filter.

* * * * *